United States Patent [19]

Park

[11] Patent Number: 5,599,731
[45] Date of Patent: Feb. 4, 1997

[54] METHOD OF FORMING A FIELD OXIDE FILM IN A SEMICONDUCTOR DEVICE

[75] Inventor: Sang H. Park, Kyungki-Do, Rep. of Korea

[73] Assignee: Hyundai Electronics Industries Co., Ltd., Kyungki-Do, Rep. of Korea

[21] Appl. No.: 498,914

[22] Filed: Jul. 6, 1995

[30] Foreign Application Priority Data

Jul. 6, 1994 [KR] Rep. of Korea ..................... 94-16087

[51] Int. Cl.$^6$ .................................................. H01L 21/76
[52] U.S. Cl. ................................ 437/70; 437/69; 437/72; 437/73
[58] Field of Search ........................... 437/69, 70, 72, 437/73, 21

[56] References Cited

U.S. PATENT DOCUMENTS

| | | | |
|---|---|---|---|
| 4,407,696 | 10/1983 | Han ................................................. | 437/70 |
| 5,308,787 | 5/1994 | Hong et al. .................................... | 437/70 |

FOREIGN PATENT DOCUMENTS

| | | | |
|---|---|---|---|
| 0091536 | 6/1982 | Japan . | |
| 0071646 | 4/1986 | Japan ....................................... | 437/70 |
| 0297837 | 11/1989 | Japan ....................................... | 437/70 |
| 0144805 | 6/1993 | Japan . | |

*Primary Examiner*—Trung Dang
*Attorney, Agent, or Firm*—Fish & Richardson P.C.

[57] ABSTRACT

The present invention discloses a method of forming a field oxide film in a semiconductor device which can minimize an occurrence of a birds beak by forming a pad polysilicon film between a nitride film and a pad oxide film, defining field regions by patterning the nitride film, and forming an oxidization prevention layer by implanting nitrogen atoms into portions where the bird's beak will otherwise occur.

2 Claims, 2 Drawing Sheets

METHOD OF FORMING A FIELD OXIDE FILM IN A SEMICONDUCTOR DEVICE

BACKGROUND OF INVENTION

1. Field of the Invention

The present invention relates to a method of forming a field oxide film in a semiconductor device, and more particularly, to a method of forming a field oxide film in a semiconductor device which can minimize an occurrence of a bird's beak by forming a pad polysilicon film between a nitride film and a pad oxide film, defining field regions by patterning the nitride film, and forming an oxidization prevention layer by implanting nitrogen atoms into portions where the bird's beak will occur.

2. Information Disclosure Statement

In general, a field oxide film is formed to isolate semiconductor elements.

FIG. 1 is a sectional view of a semiconductor device for explaining a method of forming a field oxide film according to the prior art. Referring to FIG. 1, a field oxide film 5 is formed by patterning a nitride film 3 and the pad oxide film 2 to define a field region after forming a pad oxide film 2 and a nitride film 3 on a silicon substrate 1, and by forming a channel stop region 4 on the silicon substrate 1 by an ion implantation process.

As a bird's beak B is formed from an edge of the field oxide film 5 to an active region at the time of forming the field oxide film 5, the active region is reduced, causing a great obstacle in the manufacturing of a highly integrated device.

SUMMARY OF THE INVENTION

Therefore, it is an object of the present invention to provide a method of forming a field oxide film in a semiconductor device which can improve the yield and reliability of the device by preventing the occurrence of the bird's beak in the active region.

The present invention discloses a method of forming a field oxide film, comprising steps of:

sequentially forming a pad oxide film, a pad polysilicon film, and a nitride film on a silicon substrate; forming a channel stop region after patterning the nitride film to define a field region; forming a photoresist pattern on a selected portion of the exposed pad polysilicon film, and thereafter, forming an oxidization prevention layer by implanting nitrogen atoms into the pad polysilicon film exposed at the edge of the photoresist pattern; and performing a thermal oxidization process after removing the photoresist pattern, and forming a field oxide film by removing the nitride film, pad polysilicon film, and pad oxide film.

BRIEF DESCRIPTION OF THE DRAWINGS

For a full understanding of the nature and objects of the invention, reference should be had to the following detailed description taken in conjunction with the accompanying drawings in which.

Similar reference characters refer to similar parts through the accompanying drawings.

DETAILED DESCRIPTION OF THE INVENTION

Figure 1:
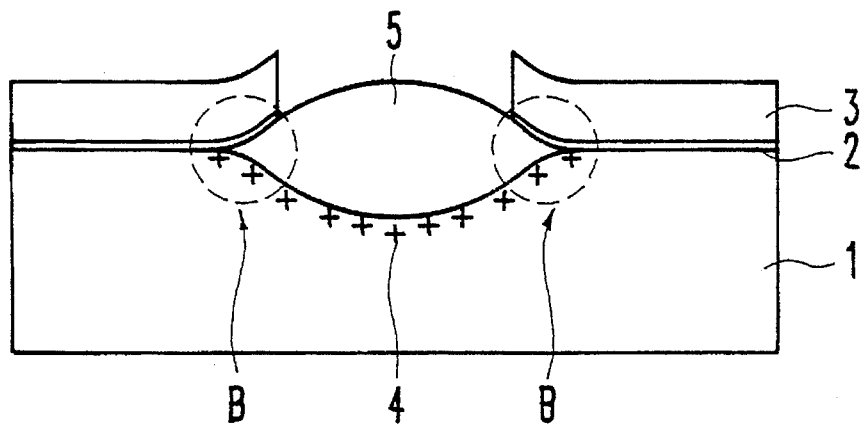
FIG. 1 is a sectional view for explaining a method of forming a field oxide film according to the prior art.
Figure 2A:
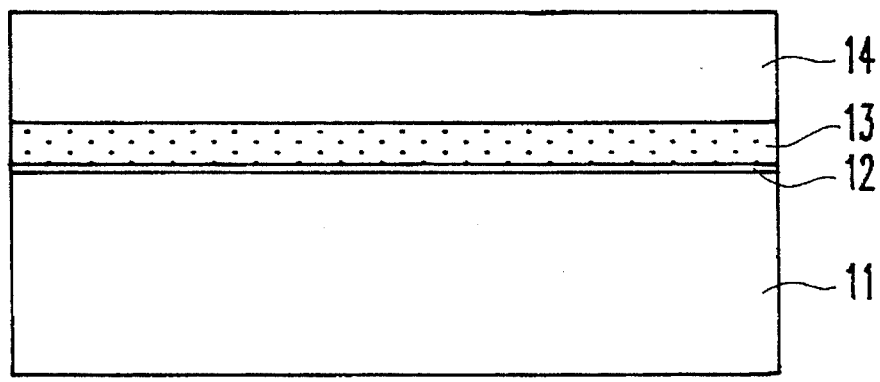
FIGS. 2A through 2E are sectional views for illustrating steps of forming a field oxide film in a semiconductor device of the present invention.

Referring to FIG. 2A, a pad oxide film 12, a pad polysilicon film 13, and a nitride film 14 are sequentially formed on a silicon substrate 11.

Figure 2B:
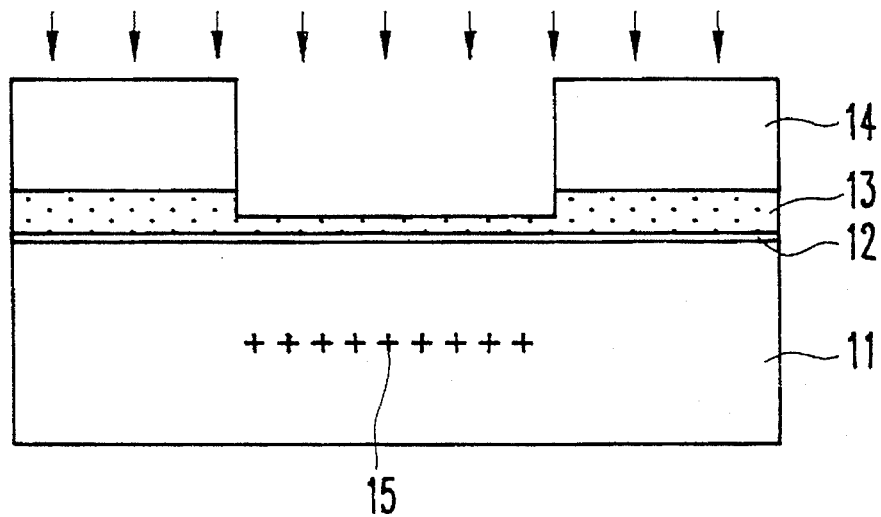

Referring to FIG. 2B, the pad polysilicon film 13 is exposed by excessively etching the nitride film 14 by an etching process utilizing an isolation mask to define a field region, and thereafter, a channel stop region 15 is formed on the silicon substrate 11 by an ion-implantation process.

Figure 2C:
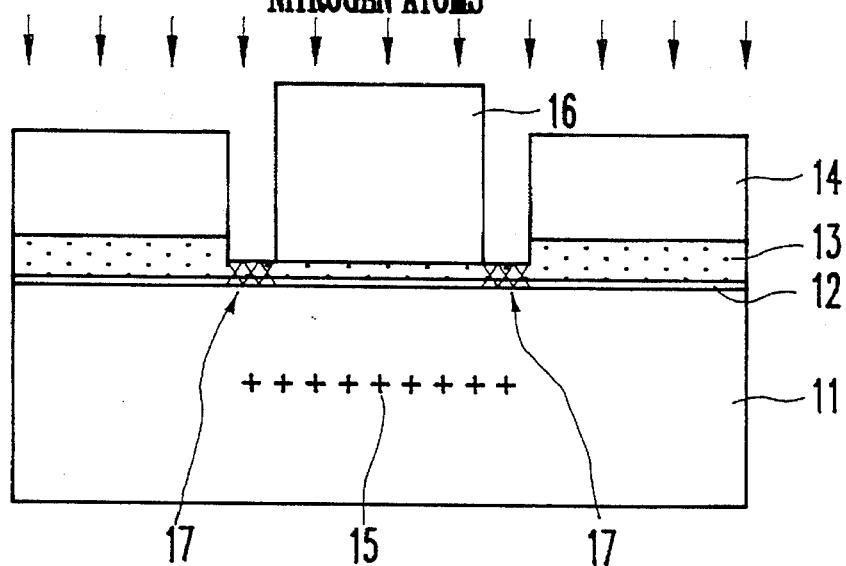

Referring to FIG. 2C, a photoresist pattern 16 is formed on a selected portion of the exposed pad polysilicon film 13, and thereafter, nitrogen atoms are ion-implanted to the pad polysilicon film 13 exposed at the edge of the photoresist pattern 16 under the condition of 10 to 30 KeV and $1\times10^{12} - 1\times10^{15}$ atoms/cm$^2$.

The nitrogen atoms are ion-implanted into the pad polysilicon film 13, which acts as an oxidization prevention area 17 during a thermal oxidization process. With either of NH$_2$ and NO gas can be used instead of the nitrogen atoms to form the oxidization prevention area 17.

Figure 2D:
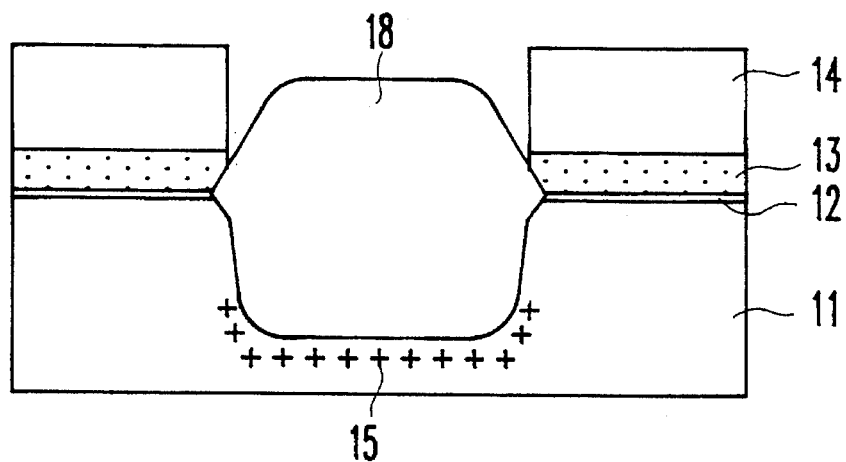

Referring to FIG. 2D, the photoresist pattern 16 is removed, and thereafter, a field oxide film 18 having a predetermined thickness is formed by the thermal oxidization process. Therefore, the bird's beak does not occur due to the oxidization prevention area 17 which is formed by the implantation of any member of the group consisting of nitrogen atoms, NH$_2$ gas, and NO gas.

Figure 2E:
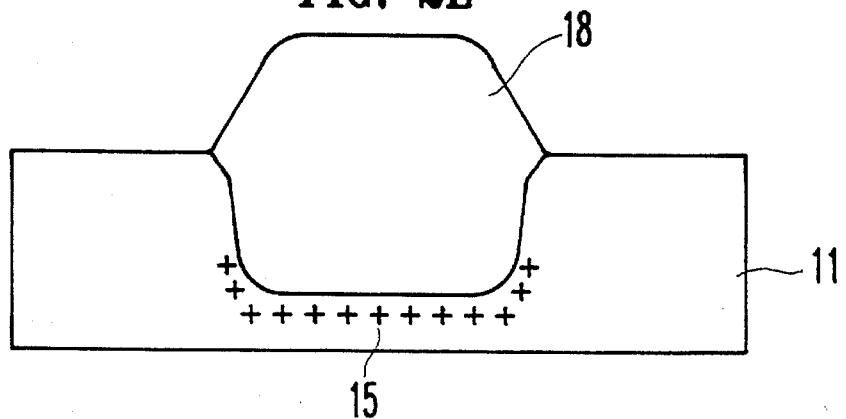

Referring to FIG. 2E, the field oxide film 18 is completed by removing the remaining nitride film 14, pad polysilicon film 13 and pad oxide film 12.

As described above, the present invention improves yield and reliability by preventing the occurrence of the bird's beak using the oxidization prevention layer.

Although this invention has been described in its preferred embodiment with a certain degree of particularity, one skilled in the art to which this invention pertains would know that the preferred embodiment disclosed here is only an example and that the construction, combination, and arrangement of its parts may be varied without departing from the spirit and the scope of the invention.

What is claimed is:

1. A method of forming a semiconductor device, comprising:

sequentially forming a pad oxide film, a pad polysilicon film, and a nitride film on a silicon substrate;

implanting impurity ions to form a channel stop region after patterning said nitride film to define a field region;

exposing a selected portion of said exposed pad polysilicon by forming a photoresist pattern;

forming an oxidation prevention area by implanting nitrogen ions into said selected portion of said pad polysilicon film exposed at an edge of said photoresist pattern;

removing said photoresist pattern and subsequently performing a thermal oxidation process; and forming a field oxide film by removing said nitride film, said pad polysilicon film, and said pad oxide film.

2. The method as in claim 1, wherein said implanting comprises using NH$_2$ or NO gas to implant nitrogen ions to form said oxidation prevention area.

* * * * *